United States Patent
Tan

[11] Patent Number: 6,011,770
[45] Date of Patent: Jan. 4, 2000

[54] METHOD AND APPARATUS FOR HIGH-ORDER BANDPASS FILTER WITH LINEARLY ADJUSTABLE BANDWIDTH

[75] Inventor: Mehmet Ali Tan, Irvine, Calif.

[73] Assignee: Texas Instrumental Incorporated, Dallas, Tex.

[21] Appl. No.: 08/988,158

[22] Filed: Dec. 10, 1997

[51] Int. Cl.$^7$ ........................................ G11B 7/00
[52] U.S. Cl. ............................... 369/124; 369/47
[58] Field of Search ................... 369/43, 44.11, 369/44.13, 44.29, 44.35, 47, 48, 53, 54, 124

[56] References Cited

U.S. PATENT DOCUMENTS

| | | |
|---|---|---|
| 4,942,564 | 7/1990 | Hofer et al. ............... 369/44.35 X |
| 5,170,387 | 12/1992 | Groen ............................. 369/59 |

*Primary Examiner*—Paul W. Huber
*Attorney, Agent, or Firm*—W. Daniel Swayze, Jr.; Wade James Brady, III; Richard L. Donaldson

[57] ABSTRACT

A method and apparatus for linearly adjusting the bandwidth of a high-order bandpass filter. A high-order bandpass filter is formed by cascading together two or more low-order bandpass filters. The bandwidths and center frequencies of each individual low-order bandpass filter is adjusted. The center frequency of some low-order bandpass filters are adjusted so as to achieve linear adjustment of the bandwidth of the high-order bandpass filter.

12 Claims, 8 Drawing Sheets

METHOD AND APPARATUS FOR HIGH-ORDER BANDPASS FILTER WITH LINEARLY ADJUSTABLE BANDWIDTH

CROSS-REFERENCED APPLICATION INFORMATION

Application Ser. No.08/988,174 entitled "Method and Apparatus for the Efficient Test of the Center Frequency of Bandpass Filters" and naming the same inventor, is hereby identified as having been filed on the same day herewith and as being jointly owned by the same assignee.

BACKGROUND OF THE INVENTION

1. Field of the Invention

The present invention relates to the field of bandpass filters, and more particularly, bandpass filters used in optical disk devices to capture a wobble signal in read head and write head circuits.

2. Description of the Related Art

Bandpass filters are often second-order or biquadratic. The bandwidth of such filters is directly the coefficient of the first-order term in the denominator polynomial of the second-order filter transfer function. Thus, linear adjustability of second-order filters is trivial and can be linearly controlled by the conductance of an element if an appropriate topology is chosen. Adjustment of bandwidth is desired in order to ensure that a particular signal—such as the wobble signal in an optical disk device—is accurately and fully passed by the filter for use by subsequent circuitry, while simultaneously increasing the filter's blocking of other unwanted signals (including noise, for example).

To accomplish linear adjustability in second-order filters, two conditions must be satisfied. First, the coefficient of the first order term in the denominator polynomial of the filter transfer function must be implemented by a conductance (not a resistance). This is necessary because the bandwidth is controlled by, and directly related to, conductance. Secondly, that conductance must be controlled by a voltage or current in a linear fashion.

MOSFETs are typically used in the positive feedback path of a second-order bandpass filter. The back-gate (or body) voltage of a MOSFET is used to control the conductance of the MOSFET. The prior art shows that conductance is linearly dependent on the controlling voltage as $$G=(\mu_p C_{ox}/2)(W/L)(v_G-V_T)$$

In the prior art, the conductance versus body voltage, or back-gate voltage, relationship is not linear. Thus, the second condition for linear adjustability is not satisfied.

Figure 1:
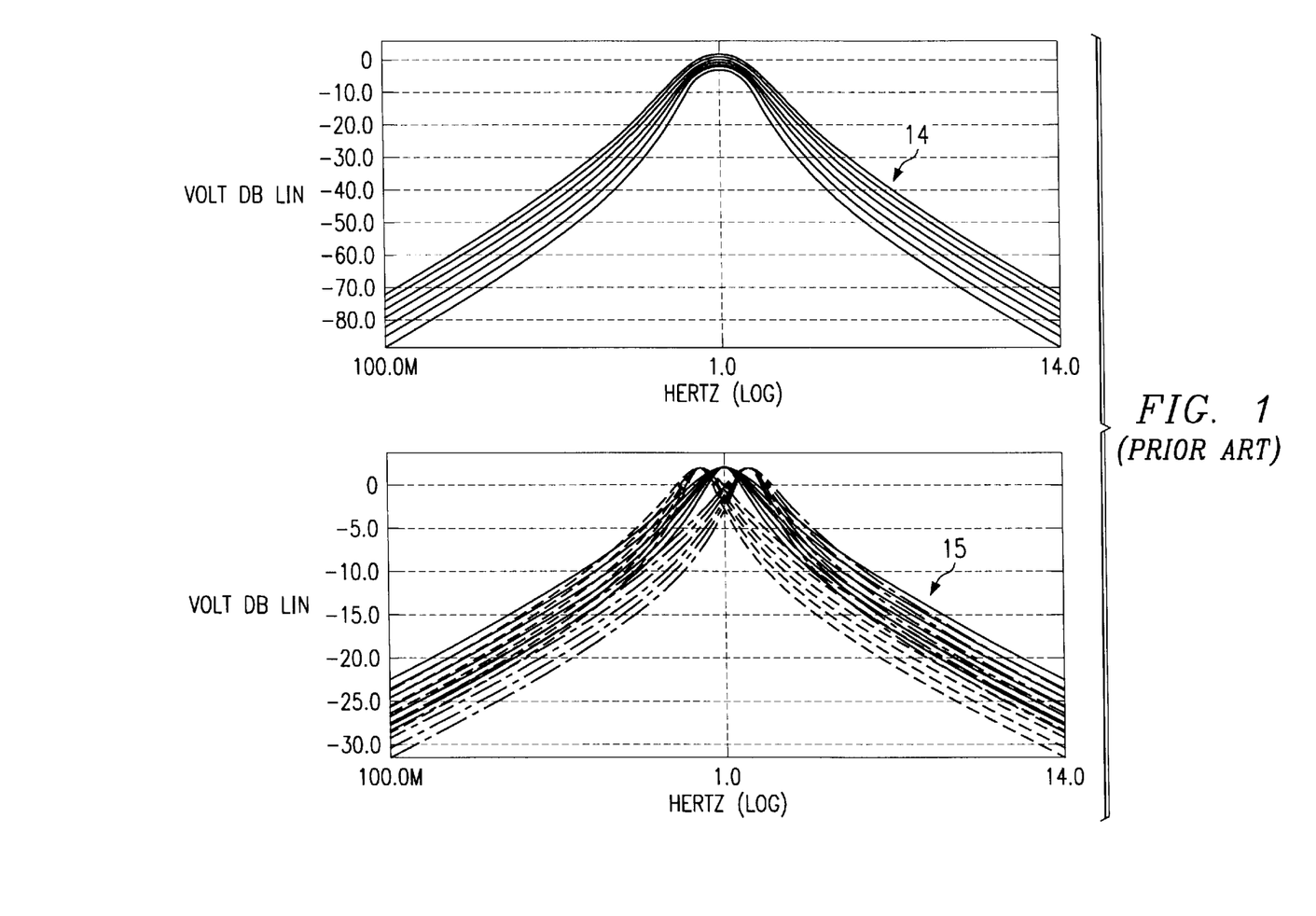
FIG. 1 is a graph that shows the overall bandwidth of a prior art high-order bandpass filter in response to linearly adjusting the bandwidths of cascaded low-order filter stages that make up the high-order filters.

The prior art also does not teach high-order bandpass filters—e.g., bandpass filters, such as those comprising cascaded first-order or second-order filters or other arrangements that provide greater than second-order filter transfer functions—that are linearly adjustable. Even assuming that the bandwidth of a second-order filter is adjusted linearly, the overall bandwidth of a higher-order bandpass filter composed of two or more cascaded second-order filters would not be adjusted linearly. FIG. 1 shows two response curves 14 and 15 related to three prior art second-order filters cascaded together. The bottom set of curves 15 shows how the bandwidths of each individual second-order filter can be linearly adjusted. The top set of curves 14 shows the effect of adjusting the bandwidths of each cascaded second-order filter on the overall bandwidth of the high-order filter. Note that, in the top set of curves 14, overall bandwidth cannot be adjusted linearly by only adjusting the bandwidth of the individual second-order stages of the filter.

Figure 2:
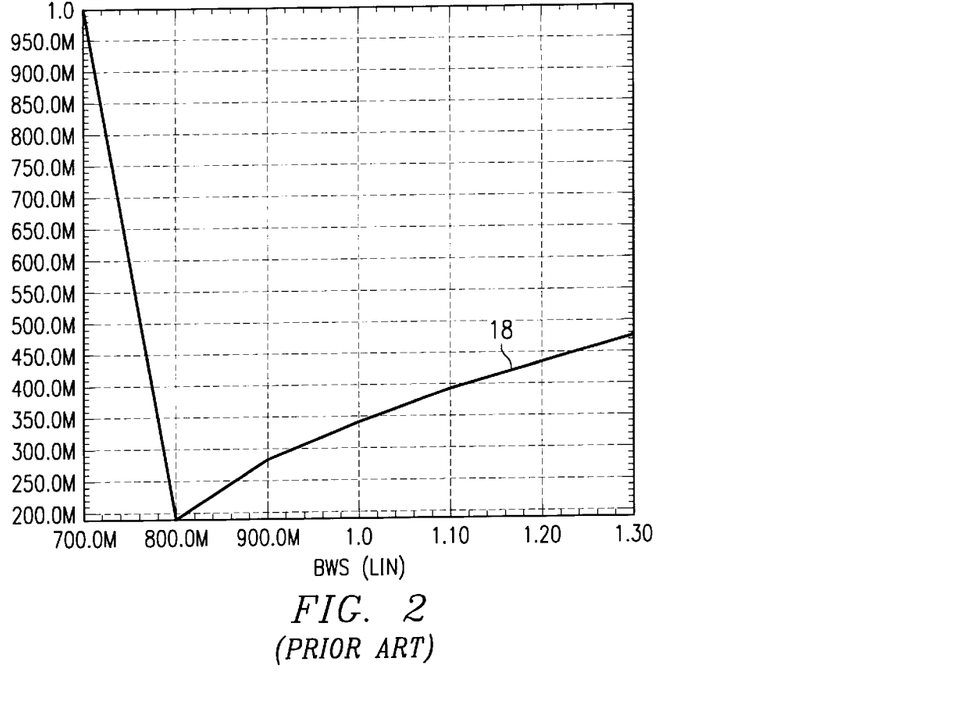
FIG. 2 is a graph that shows response characteristics of an adjusted overall bandwidth of a prior art high-order filter versus bandwidth scaling factor (BWS)

Moreover, the bandwidth of such a higher-order filter may not even be monotonous upon adjustment, that is, either always increasing or always decreasing but never both during adjustment in a particular direction. In other words, as the conductance of each second-order filter stage increased, the bandwidth might first go down but then up (or vice versa)—which is neither monotonous nor linear in behavior. FIG. 2 shows how the overall bandwidth of a high-order (i.e., sixth-order) filter is not linear in response to linear adjustment of its three cascaded second-order filters. In this Figure, the adjusted overall bandwidth of the high-order filter versus the bandwidth scaling factor (BWS), which is proportional to the bandwidths of individual second-order filters only, is shown by line 18.

Accordingly, prior art higher-order filters are deficient since, by varying linearly the bandwidths of each second-order bandpass filter block of a sixth-order bandpass filter, for example, overall bandwidth cannot be adjusted linearly.

Active Filter Models

Active filters, such as those usually using operational amplifiers (op amp), may generally be constructed by interconnecting commonly used elementary building blocks (also referred to herein as "models"). Examples of such known models include summers, integrators, and second-order biquads. These are well-known building blocks that are used in filter design.

In summers, various input signals are applied to the input of the summer. Generally, the output voltage is the negative sum of the input voltages when the input is fed into the negative input of the op amp. A summer has a resistance, but no capacitance, in the feedback path from the output of the op amp to the negative input of the op amp. Integrators are similar to summers, except that they have a capacitance in the feedback path. They may or may not contain a resistance in the feedback path. Their output voltage is the input voltage integrated over time. Biquads are usually formed using summers and/or integrators. The biquad is probably the most important basic building block used in the design of active filters. It typically realizes a transfer function such as:

$$H(s) = \frac{Bs}{s^2 + A_1 s + A_0}$$

where $A_1$ is the bandwidth, $A_0$ is the angular center frequency $((2\pi f_{cntr})^2)$, $s=j\omega$ is the frequency parameter (where $\omega=2\pi f$ is the radian frequency (rad/s)), and $B=A_1$ multiplied by the gain at the center frequency is the gain of the filter.

A basic filter design approach is: (1) determine the transfer function of the desired filter, (2) obtain a signal flow graph (SFG) that realizes the transfer function of the desired filter, and then (3) obtain the corresponding filter circuit from that SFG. Consequently, the filter circuit will implement the target transfer function.

There may be many SFGs realizing the same transfer function. And, although they implement the same function, various circuits corresponding to different SFGs can behave differently. Differences that may exist include adjustability range, adjustability shape (i.e., the relationship of some parameters, such as center frequency or bandwidth or gain, to branch variables), sensitivity to variations in parameters and the like. This invention, in one part, involves the generation of signal flow graphs from which can be made linearly adjustable high order bandwidth filters. These signal flow graphs can be implemented in a wide variety of filter circuits.

It is also worthy to note that it is known that the transfer function of an SFG can be derived either by using Mason's gain formula or by solving a system of linear equations, each of which corresponds to sub-blocks of SFGs containing one internal node or output node.

Finally, in connection with generating SFGs in accordance with this aspect of the invention, it is noted that the linear equation represented by each sub-graph is unique. Accordingly, each exclusive sub-graph of an SFG yields an equation, and the entire SFG corresponds to a set of linear equations.

This filter design approach is described step by step, as follows, by way of an example. Assume the transfer function is, as described previously, expressed by the following:

$$H(s) = \frac{Bs}{s^2 + A_1 s + A_0}$$

Figure 3:
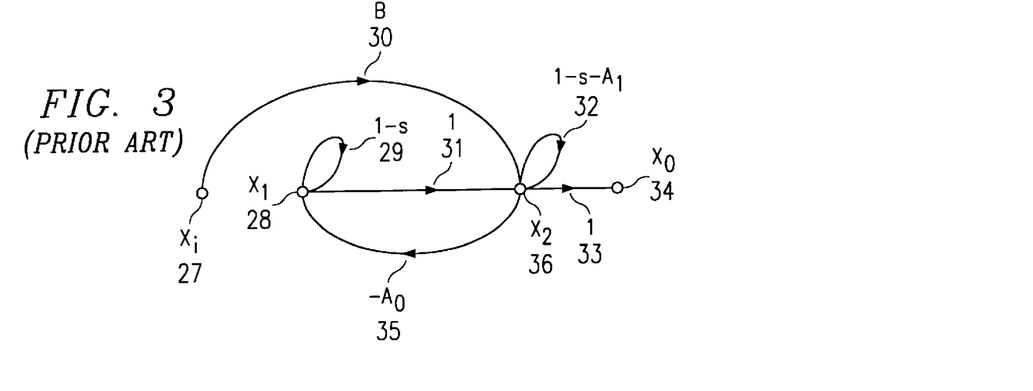
FIG. 3 is a signal flow graph of an exemplary second-order transfer function.

A signal flow graph that realizes this function is shown in FIG. 3, in which reference character 27 denotes the input to the filter, 34 denotes the output from the filter, reference characters 29–33 and 35 denote branches of the signal flow graph, and reference characters 28 and 36 denote internal voltage node variables. In a known manner, the SFG shown in FIG. 3 may essentially be formed by interconnecting two sub-graphs (i.e., where a branch otherwise present in a sub-graph is missing in FIG. 3, such a "missing branch" effectively corresponds to a branch with zero (0) valued branch transmittance). The SFG can be verified as having the desired transfer function by using Mason's gain formula.

Figure 4:
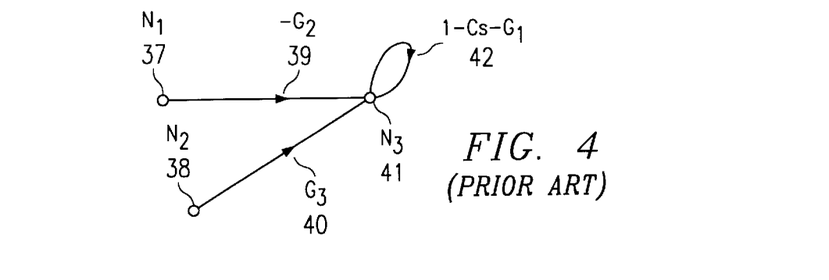
FIG. 4 is a signal flow graph of the transfer function of an integrator.

The sub-graph in FIG. 4 is an example of a transfer function of a filter model comprising an integrator. The output depicted in this sub-graph corresponds to node 41 ($N_3$), and corresponds to integration of the voltages applied to inputs 37 ($N_1$) and 38 ($N_2$). The specific manner in which the illustrated transfer function is implemented in a filter circuit is explained, below, in connection with the circuit shown in FIG. 5. In the SFG of FIG. 4, elements 39 ($G_2$), and 40 ($G_3$) represent conductances and loop 42 represents a feedback path from the output of op amp 41 to its input, which path contains a capacitor having a capacitance s and conductance $G_1$.

Synthesis of a Circuit Implementing a SFG

Figure 5:
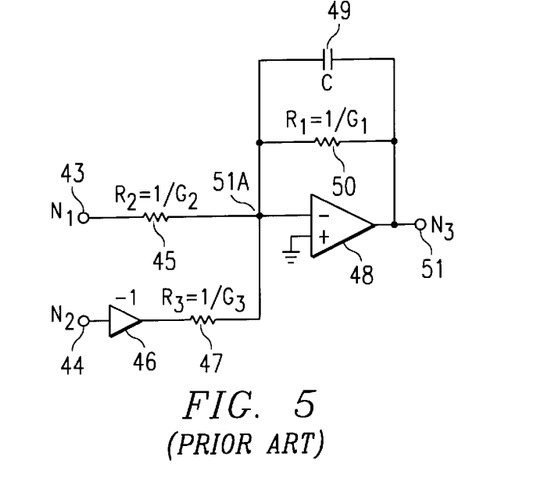
FIG. 5 is a schematic of a circuit for producing the signal flow graph depicted in FIG. 4.

The circuit shown in FIG. 5 (or sub-circuit, since it may be used to build the overall filter circuit) corresponds in performance to the sub-graph of FIG. 4. Inputs 43 ($N_1$) and 44 ($N_2$) in FIG. 5 correspond to inputs 37 ($N_1$) and 38 ($N_2$) in FIG. 4. Node 41 ($N_3$) in FIG. 4 corresponds to op amp 48 in FIG. 5. Loop 42 in FIG. 4 corresponds to an RC circuit formed by a capacitor 49 and a resistor 50 in FIG. 5, which is connected between the output 51 of op amp 48 and the negative input 51A of the op amp 48. Conductance 39 ($-G_2$) of FIG. 4 corresponds to resistor 45 in FIG. 5, and conductance 40 ($G_3$) corresponds to an inverter 46 and a resistor 47 in FIG. 5. The voltage at output 51 in FIG. 5 corresponds to the integration of the voltages on inputs 43 and 44 of op amp 48 together with the voltage from RC circuit 49–50 going to node 51A.

Such sub-circuits can, in known fashion, be interconnected in the same way as the manner in which their corresponding sub-graphs are interconnected, thereby forming the entire SFG. In this manner, the filter circuit that corresponds to that overall SFG is constructed. It is also noteworthy that if, for a given SFG, the designer chooses a different type of sub-circuit (e.g., a Transconductance-C implementation, rather than a MOSFET-C implementation), a different filter circuit may be implemented. However, basic circuit properties, such as parameter-component value relationships (e.g., the linear relationship between the bandwidth and the MOSFET gate voltages, which is proportional to the conductance value of those MOSFETs), inherited from the topology (i.e., circuit interconnection form or architecture) remain the same for all of these circuits since they possess the same topology. In other words, they have been created from the same SFG.

Although the prior art has included these filter design techniques, they have not heretofore been used or combined in a manner that resulted in a higher-order bandpass filter characterized by linearly adjustable bandwidth. Accordingly, a need has existed relating to the design and implementation of such filters.

SUMMARY OF THE INVENTION

Accordingly, the present invention is directed to a high-order bandpass filter that substantially obviates one or more of the problems arising from the limitations and disadvantages of the related art.

It is an object of the present invention to provide for linear bandwidth adjustment in a high-order bandpass filter.

It is also an object of the present invention to provide a high-order bandpass filter in which the bandwidth adjustment behaves in a well-defined and predictable manner.

It is another object of the present invention to provide a high-order bandpass filter that allows selectivity of the bandwidth, thus providing optimal performance and decreased noise.

It is a further object of the present invention to provide a high-order bandpass filter that can easily be controlled via firmware.

Additional features and advantages of the invention will be set forth in the description as follows, and in part will be apparent from the description or may be learned by practice of the invention. The objectives and other advantages of the invention will be realized and attained by the methods and apparatus particularly pointed out in the written description and claims hereof together with the appended drawings.

To achieve these and other advantages, and in accordance with the purposes of the invention, as embodied and broadly described, the invention comprises a high-order bandpass filter that includes a first low-order bandpass filter having a linearly adjustable bandwidth cascaded to one or more second low-order bandpass filters, each cascaded in turn, where each one or more second low-order bandpass filters has a linearly adjustable bandwidth and the center frequency of one or more of said one or more second bandpass filters is adjusted, thereby providing a linearly adjustable overall bandwidth for the high-order bandpass filter.

BRIEF DESCRIPTION OF THE DRAWINGS

The present invention is illustrated by way of example, and not by way of limitation, by the figures of the accompanying drawings in which like reference numerals refer to similar elements, and in which.

DETAILED DESCRIPTION OF THE INVENTION

In Digital Versatile Disk or Digital Video Disk ("DVD-RAM") systems and in Compact Disk ("CD-RW") systems, information is read and/or written optically on a medium. To accomplish such operations, the systems include read channel and (if capable of recording on the medium) write circuits that convey a multitude of data and control signals to and from the disk. Commonly, a wobble signal is one signal embedded within a group of signals that are sent to or from the read head and the write heads. The wobble signal can be used, for example, to determine location on the disk or to otherwise coordinate the passing of information from the disk to the read and write heads. The wobble signal is typically a sinusoidal signal having a frequency in the range from 80 kHz to 200 kHz.

A bandpass filter is used to capture the wobble signal from amongst the group of signals. It is desirable that this bandpass filter be adjusted for optimal performance, e.g., to reduce noise and to increase capture of the wobble signal, so as to achieve maximum accuracy and minimum delays in the read and write operations of the optical disk. The specific construction of the bandpass filter is determined by the particular application, but tends to be a high order (typically sixth order) filter having a center frequency that is the same as the frequency of the wobble signal. To best achieve the foregoing advantageous operations, it is desired that the bandwidth of the filter be adjustable. Linearly adjustable bandwidths make it easier to perform this adjustment, and allow the system firmware to store easily information concerning the bandwidth and manner of adjusting it.

Wobble signal capture system

Figure 6:
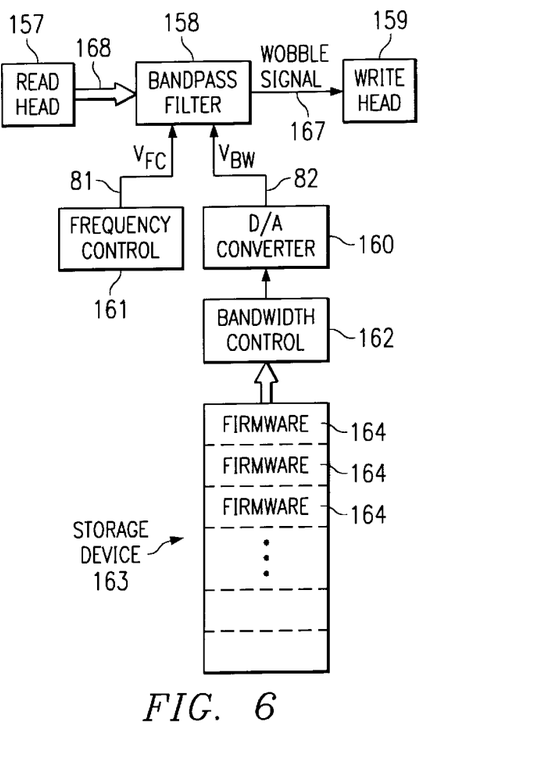
FIG. 6 is a block diagram of an optical disk wobble signal capture system according to the present invention.

FIG. 6 depicts a system that captures a wobble signal that may be used, for example, to control the location of a write head in a writeable optical disk. Firmware is stored in a storage device 163, such as a register or other memory that may be under the control of suitable means, e.g., a microcontroller or microprocessor (not shown).

The exemplary system stores in firmware 164 control parameters for adjusting the bandwidth of the bandpass filter 158. This firmware data 164 are sent to bandwidth control logic 162 where they are decoded, with the results inputted to corresponding digital-to-analog converters 160 from which a bandwidth control voltage 82 ($V_{BW}$) is generated in order to adjust the bandwidth of the high-order bandpass filter 158. A center frequency control voltage 81 ($V_{FC}$) controls adjustment of the center frequency of the high-order bandpass filter 158, and is inputted to the filter from a center frequency control 161. The center frequency control 161 may contain logic used to determine a desired frequency based on testing of the response of the bandpass filter, or it may provide frequency control voltage 81 as derived from an outside source (not shown).

Both the bandwidth control voltage 82 and the center frequency control voltage 81 are, in a presently preferred embodiment, DC voltages. High-order bandpass filter 158 receives a group of signals 168, including a wobble signal 167, from the read head circuitry 157. There may be further circuitry between the read head 157 and the bandpass filter 158 to amplifies the read head signal or otherwise modify these signals in order to interface with the input to the bandpass filter 158. Wobble signal 167 is captured by high-order bandpass filter 158 and inputted to write head circuitry 159. In similar fashion, there may be further circuitry between bandpass filter 158 and write head circuitry 159 that operates on the wobble signal 167 to insure compatibility with write head circuitry 159. Information contained in wobble signal 167 may be used by the write head circuitry 159 to determine such matters as the next location of the write head or the like.

Figure 7:
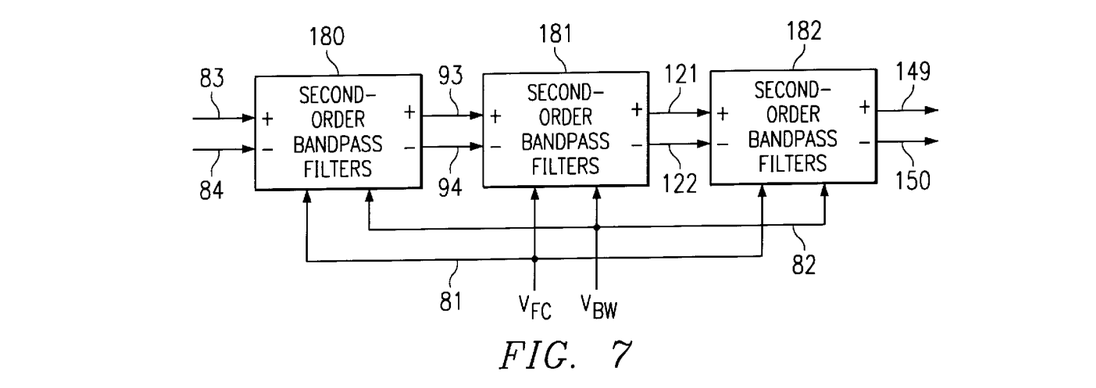
FIG. 7 is a block diagram of a plurality of cascaded second-order filters that form a high-order bandpass filter according to the present invention.

A presently preferred embodiment of a high-order bandpass filter according to the present invention is a sixth-order filter composed of three cascaded second-order bandpass filters 180, 181 and 182, as depicted in FIG. 7. The group of signals 168 from the read head circuitry (FIG. 6) are connected to inputs 83 and 84 of the first second-order bandpass filter section 180. Outputs 93 and 94 of the first second-order bandpass filter comprise inputs to the second second-order bandpass filter 181. Outputs 121 and 122 of the second second-order bandpass filter comprise inputs to the third second-order bandpass filter 182. The signal from the third second-order bandpass filter 182 at outputs 149 and 150 is the ultimate output of the overall filter 158 and, in the preferred embodiment, constitutes wobble signal 167 described previously.

Center frequency control voltage 81 and bandwidth control voltage 82 are inputted to all three second-order filters 180, 181 and 182. Thus, center frequency control voltage 81 controls the center frequency of the high-order bandpass filter 158, whereas bandwidth control voltage 82 controls the bandwidths of all three second-order filters 180, 181 and 182, but also has been found to affect the center frequencies of second second-order filter 181 and third second-order filter 182. As bandwidth control voltage 82 increases, the bandwidths of all three second-order filters 180, 181 and 182, decreases. If bandwidth control voltage 82 is constant then, as center frequency control voltage 81 increases, the center frequency of all three second-order filters 180, 181 and 182 decreases while their bandwidths remain constant.

The center frequencies for the second second-order filter 181 and the third second-order filter 182 can be linearly adjusted. The net effect of such adjustments creates a linearly adjusted bandwidth for the high-order bandpass filter 158. The center frequency of the high-order bandpass filter 158 is not affected by the bandwidth control voltage 82; it is only affected by the center frequency control voltage 81. The bandwidth control voltage 82, by linearly adjusting the center frequencies for the second second-order filter 181 and the third second-order filter 182, linearly adjusts the bandwidth of the high-order bandpass filter 158. This is further explained below.

Circuit Implementation

As discussed previously, a basic filter design approach is to first determine the transfer function of the desired filter. Next, a signal flow graph that realizes the transfer function of the desired filter is obtained. Finally, a corresponding filter circuit from that signal flow graph is obtained. These steps will now be explained in connection with the sixth-order bandpass that is the presently preferred embodiment of the invention.

Figure 8:
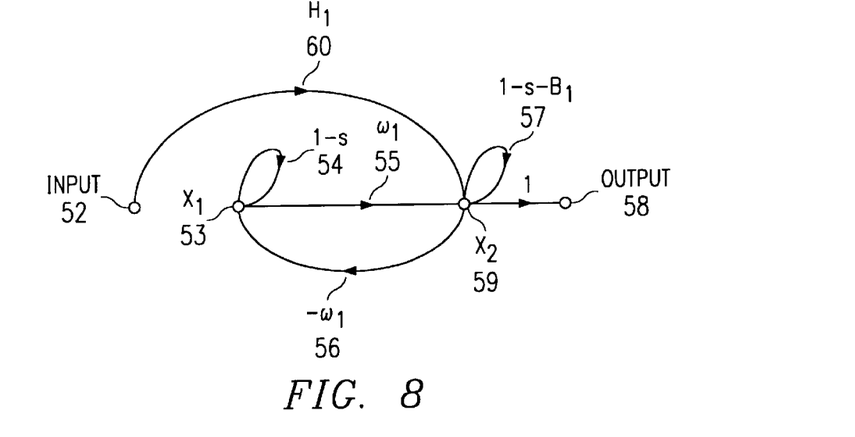
FIG. 8 is a signal flow graph of a first second-order bandpass filter section in a filter constructed according to the present invention.
Figure 9:
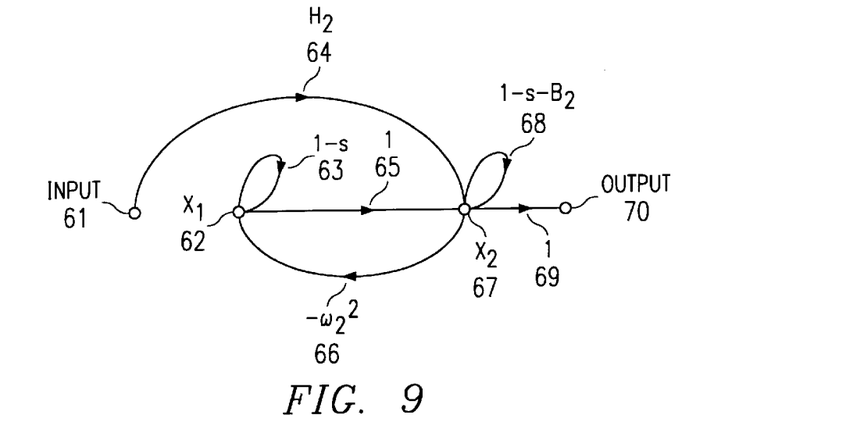
FIG. 9 is a signal flow graph of a second second-order bandpass filter section in a filter constructed according to the present invention.
Figure 10:
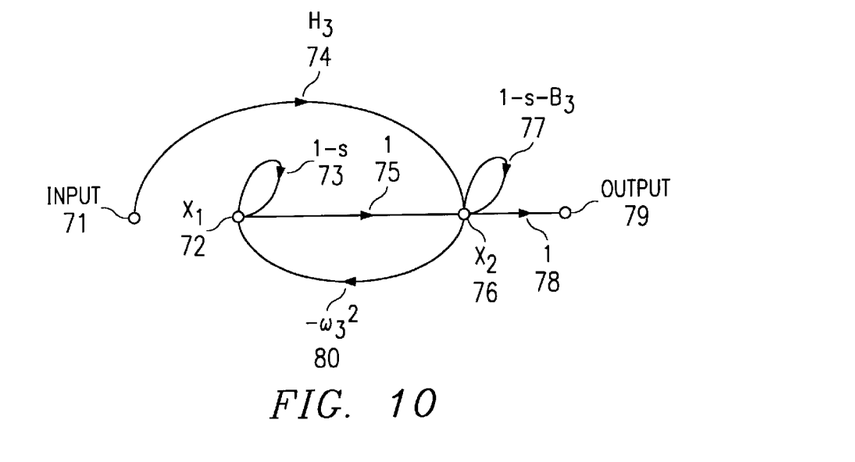
FIG. 10 is a signal flow graph of a third second-order bandpass filter section in a filter constructed according to the present invention.

One transfer function of high-order bandpass filter 158 is given in Eqn. (1). This transfer function has three distinct parts, corresponding to the three second-order filters 180, 181 and 182. Signal flow graphs implementing the second-order filters 180, 181 and 182 are depicted in FIGS. 8, 9 and 10, respectively. The topology of each of these signal flow graphs is defined by the transfer function of each respective individual low-order filter section and by the relationships between the center frequencies and bandwidths of the second-order filters and the high-order filter. These relationships, as well as the values of the conductance parameters in the branches of the signal flow graphs, can be determined in the manner described herein.

The SFG branch values (transmittances) $B_1$, $B_2$, $B_3$, $\omega_1$, $\omega_2^2$, $\omega_3^2$ are expressed in terms of $B_A$, the overall bandwidth of the high-order filter. Each term in each expression for these parameters corresponds to the conductance of a corresponding MOSFET. The conductances proportional to $\beta$ represent MOSFETs that are controlled via their gate voltage connected to $V_{BW}$. The gates of the other MOSFETs, which correspond to constant terms, are connected to receive $V_{FC}$.

The relationships and parameters in the signal flow graphs of FIGS. 8–10 evolve from a series of equations that utilize the transfer function given in Eqn. (1). These equations define the relationships between: the bandwidth of the second-order filter sections and the overall bandwidth of the high-order filter; the center frequencies of the second-order filter sections and the overall center frequency of the high-order filter; and the center frequencies of the second-order filter sections and the overall bandwidth of the high-order filter. These equations are discussed in detail below. The signal flow graphs in FIGS. 8, 9 and 10, taken together, along with the relationships and values of the parameters, represent the operational characteristics of the high-order bandpass filter desired.

Embodiments of the circuit may be implemented by using any class of active circuits, such as MOSFET-C or Transconductance-C circuits, based on the signal-flow graph approach. A MOSFET-C circuit implementation (i.e., the circuit contains only MOSFETs and capacitors) may be more useful for applications intended for lower frequencies, below 500 KHz. Transconductance-C implementations may be better for applications intended for frequencies above 500 KHz.

Figure 11:
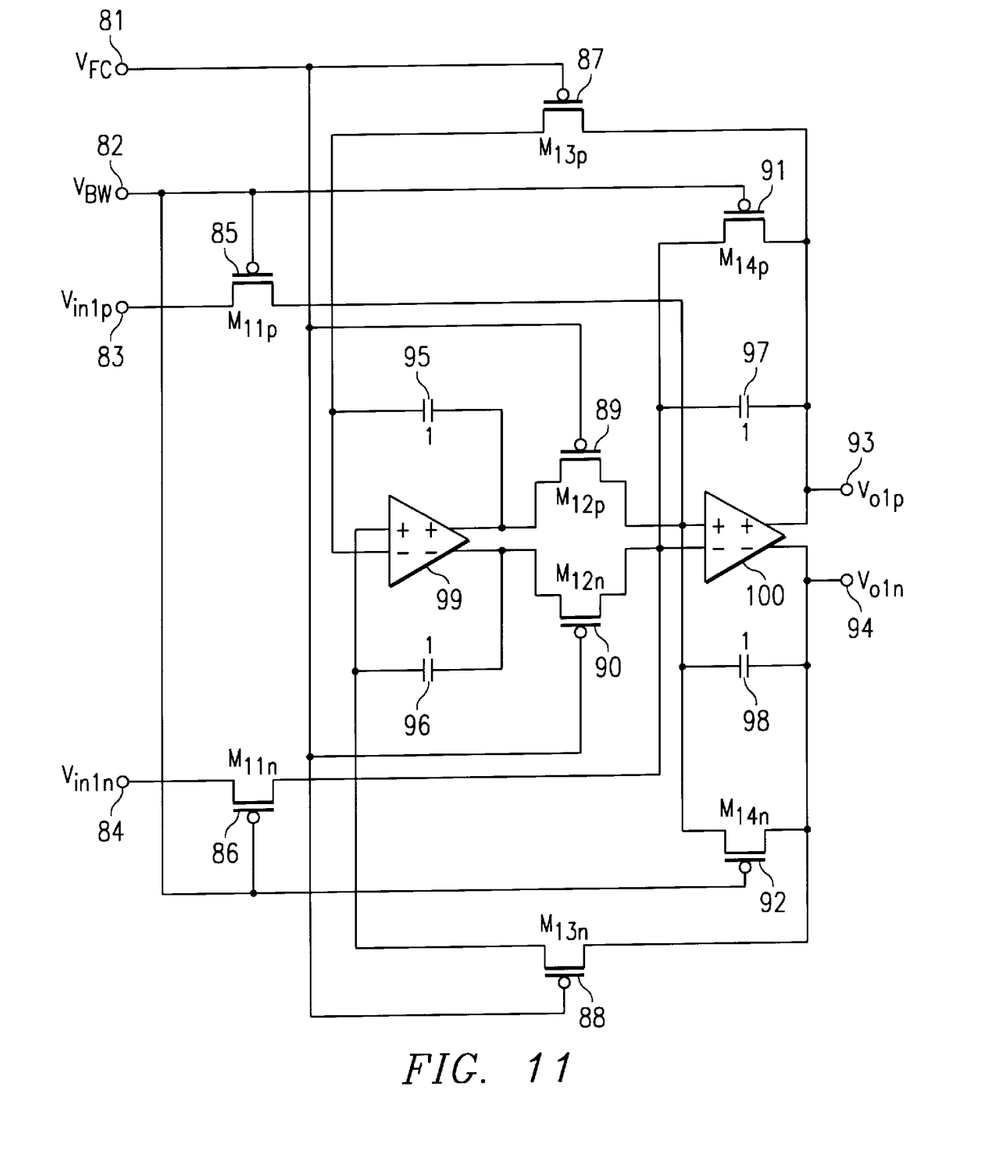
FIG. 11 is a schematic of a MOSFET-C circuit implementing a first bandpass biquad in a filter constructed according to the present invention.
Figure 12:
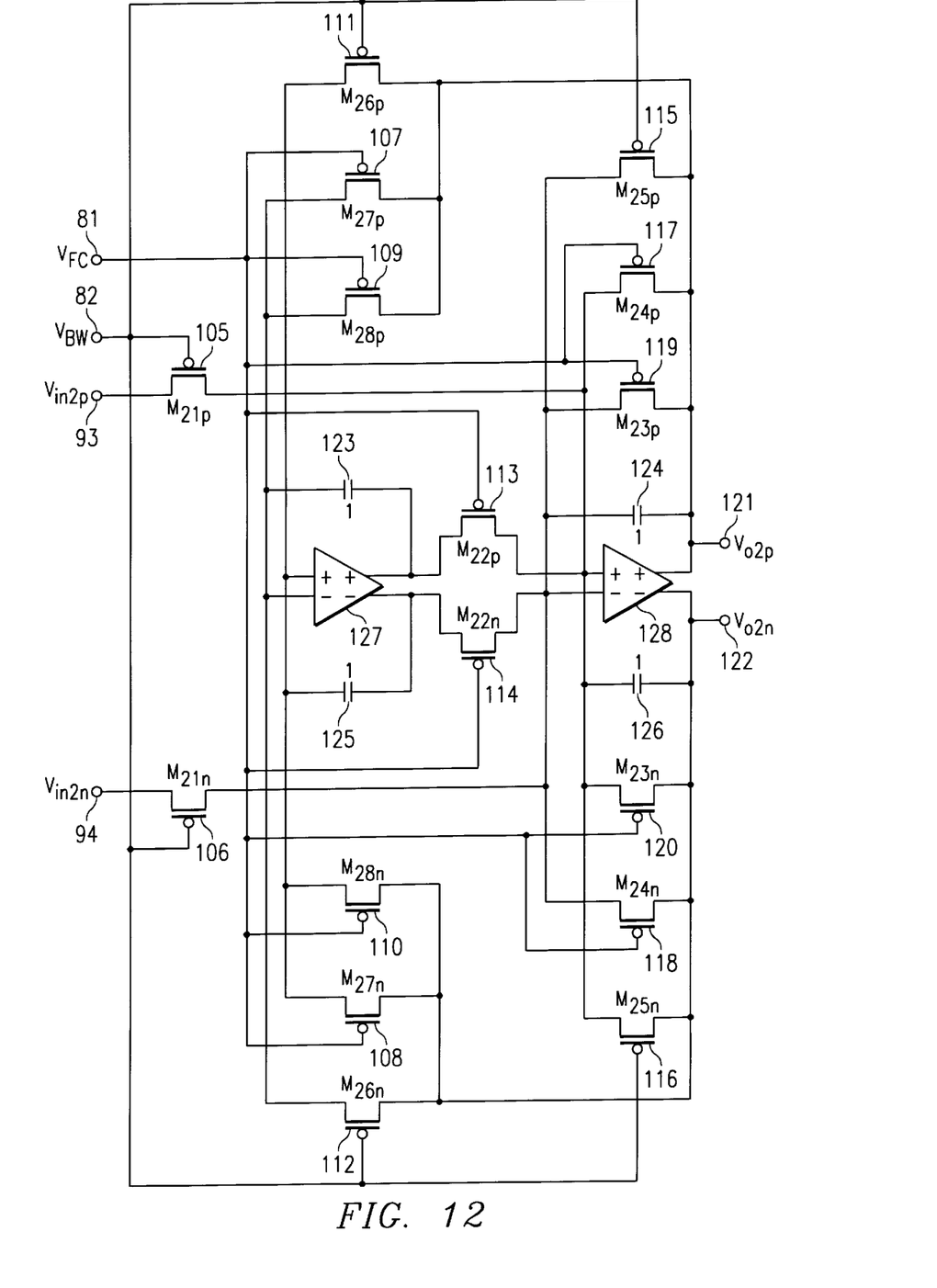
FIG. 12 is a schematic of a MOSFET-C circuit implementing a second bandpass biquad in a filter constructed according to the present invention.
Figure 13:
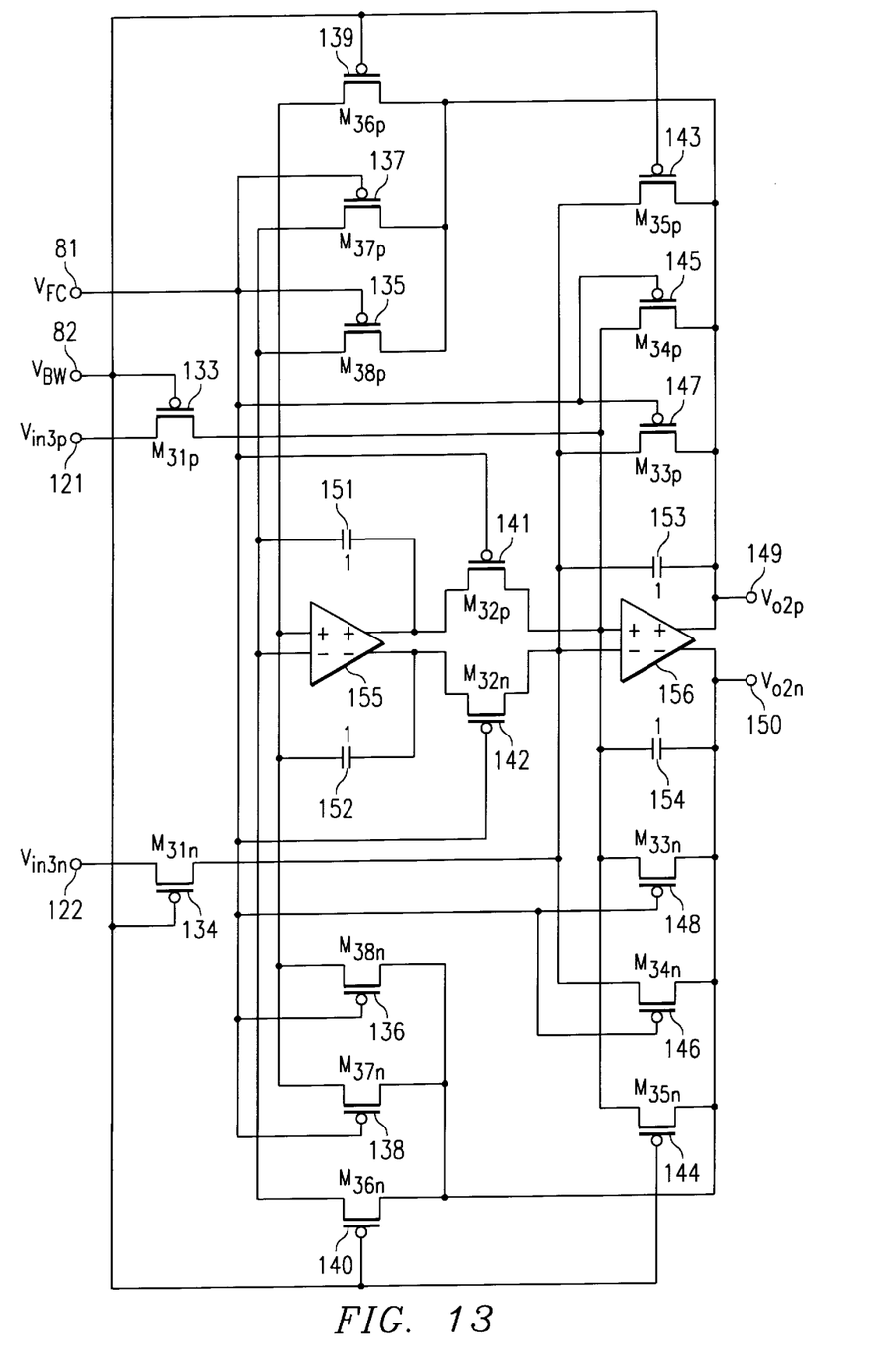
FIG. 13 is a schematic of a MOSFET-C circuit implementing a third bandpass biquad in a filter constructed according to the present invention.

A presently preferred implementation of this invention involves an embodiment using MOSFET-C circuits. The circuits can be obtained from the signal-flow graphs and the branch transmittances listed in Eqn.(23)–(34), as shown in FIGS. 11, 12 and 13. In particular, the circuits of FIGS. 11, 12 and 13 can each be viewed as two integrators centered around the op amps. The first integrator output is integrated by the second integrator, and the second integrator output is integrated by the first integrator.

FIG. 11 shows a circuit implementing the signal flow graph in FIG. 8, which corresponds to the first second-order filter 180. The first integrator in this circuit comprises op amp 99, capacitors 95 and 96, and MOSFETs 87–88. The second integrator comprises op amp 100, capacitors 97 and 98, and MOSFETs 85–86, 89–90 and 91–92. Referring to both FIGS. 8 and 11, node 53 corresponds to op amp 99; loop 54 corresponds to the output of op amp 99 and capacitors 95 and 96; branch 56 corresponds to MOSFETs 87–88; node 59 corresponds to op amp 100; loop 57 corresponds to the output of op amp 100 and capacitors 97 and 98, and MOSFETs 91–92; branch 60 corresponds to MOSFETs 85–86; and branch 55 corresponds to MOSFETs 89–90. Equations (7) and (8) define the relationships and values of the branch parameters of FIGS. 8 and 11. From these equations: $B_A\sigma$ corresponds to MOSFETs 91–92 that are controlled by $V_{BW}$; $\omega_1$ corresponds to MOSFETs 89–90 that are controlled by $V_{FC}$; and $-\omega_1$ corresponds to MOSFETs 87–88 that are controlled by $V_{BW}$.

FIG. 12 shows a circuit implementing the signal flow graph in FIG. 9, which corresponds to the second second-order filter 181. The first integrator in this circuit comprises op amp 127, capacitors 123 and 125, and MOSFETs 107–108, 109–110 and 111–112. The second integrator in the circuit comprises op amp 128, capacitors 124 and 126, and MOSFETs 103–104, 105–106, 113–114, 115–116, 117–118 and 119–120. Referring to both FIGS. 9 and 12, node 62 corresponds to op amp 127; loop 68 corresponds to the output of op amp 128 and capacitors 124 and 126, and MOSFETs 115–116, 117–118 and 119–120; branch 65 corresponds to MOSFETs 113–114; node 67 corresponds to op amp 128; branch 66 corresponds to the output of op amp 128 and capacitors 97 and 98, and MOSFETs 107–108, 109–110 and 111–112; branch 64 corresponds to MOSFETs 103–104 and 105–106; and loop 63 corresponds to the output of op amp 127 and capacitors 123 and 125. Equations (35) and (39) define the relationships and values of the branch parameters of FIGS. 9 and 12. The signs in front of these values determine how the MOSFETs in the circuit are connected. A negative sign in front of a value indicates a MOSFET in a path from a positive output to a negative input, or vice versa. From these equations, the normalized conductance value of the identified MOSFET pairs is determined as: −0.2509 corresponds to MOSFETs 111–112 that are controlled by $V_{BW}$; +0.2509 corresponds to MOSFETs 107–108 that are controlled by $V_{FC}$; +0.7136 corresponds to MOSFETs 109–110 that are controlled by $V_{FC}$; +0.4782 corresponds to MOSFETs 115–116 that are controlled by $V_{BW}$; −0.4782 corresponds to MOSFETs 117–118 that are controlled by $V_{FC}$; and +0.4226 corresponds to MOSFETs 119–120 that are controlled by $V_{FC}$.

FIG. 13 implements the signal flow graph shown in FIG. 10, and corresponds to the third second-order filter 182. The first integrator of this circuit comprises op amp 155, capacitors 151 and 152, and MOSFETs 135–136, 137–138 and 139–140. The second integrator of the circuit comprises op amp 156, capacitors 153 and 154, and MOSFETs 133–134, 141–142, 143–144, 145–146 and 147–148. Referring to both FIGS. 10 and 13, node 72 corresponds to op amp 155; loop 77 corresponds to the output of op amp 156 and capacitors 153 and 154, and MOSFETs 143–144, 145–146 and 147–148; branch 75 corresponds to MOSFETs 141–142; node 78 corresponds to op amp 156; branch 80 corresponds to the output of op amp 156 and capacitors 153 and 154, and MOSFETs 135–136, 137–138 and 139–140; branch 74 corresponds to MOSFETs 133–134; and loop 73 corresponds to the output of op amp 155 and capacitors 151 and 152. Equations (36) and (40) define the relationships and values of the branch parameters of FIGS. 10 and 13. The signs in front of these values determine how the MOSFETs in the circuit are connected. A negative sign in front of a value indicates a MOSFET in a path from a positive output to a negative input, or vice versa. From these equations, the normalized conductance value of the identified MOSFET pairs is determined as: +0.4965 corresponds to MOSFETs 139–140 that are controlled by $V_{BW}$; −0.4965 corresponds to MOSFETs 137–138 that are controlled by $V_{FC}$; +1.416 corresponds to MOSFETs 135–136 that are controlled by $V_{FC}$; +0.2357 corresponds to MOSFETs 143 and 144 that are controlled by $V_{BW}$; −0.2357 corresponds to MOSFETs 145–146 that are controlled by $V_{FC}$; and +0.2907 corresponds to MOSFETs 147–148 that are controlled by $V_{FC}$.

Regarding FIGS. 11–13, the input signals to the second-order filter are passed through MOSFETs that convert the signal voltages into currents. The MOSFETs in the presently preferred embodiment are PMOS devices; therefore, as the voltage on the gate of these devices increases in the negative direction relative to the source and drain voltages, the MOSFETs will turn on and increase in conductivity. Two op amps are used because each of these circuits represent a second-order filter, i.e., one op amp is required for implementation of each order of the filter. MOSFETs connected to center frequency control voltage 81 are used in the center frequency adjustment of high-order bandpass filter 158, whereas MOSFETs connected to bandwidth control voltage control 84 are used in the bandwidth adjustment of high-order bandpass filter 158. How the MOSFETs are interconnected—that is, whether they are in a feedback path, or whether they are connected to the positive or negative input of the op amp, or whether they are connected to the first op amp or the second op amp—is determined by the relationships and the parameter values developed in the equations that follow.

In the circuits shown in FIGS. 11–13, the inputs ($V_{inXp,n}$) to each of second-order filters 180–182 are differential input voltages; the outputs ($V_{oXp,n}$) of each of second-order filters 180–182 are differential output voltages; and signals 82 and 81 are, respectively, the bandwidth control voltage ($V_{BW}$) and center frequency control voltage ($V_{FC}$), which linearly adjust the conductances of the even-numbered MOSFET devices (86, 88, 92, 90, 106, 108, 110, 112, 114, 116, 118, 120, 134, 142, 136, 138, 140, 144, 146 and 148) (also labeled $M_{XYn}$'s) and the odd-numbered MOSFET devices (85, 87, 91, 89, 105, 113, 109, 107, 111, 119, 117, 115, 133, 141, 135, 137, 139, 147, 145 and 143) (also labeled $M_{XYp}$'s).

The circuit implementation according to a preferred embodiment is fully differential to provide better linearity and noise behavior. According to this embodiment, the MOSFETs in the bottom portion of the figures ($M_{XYp}$'s) are preferably matched with the MOSFETs in the top portion of the figures ($M_{XYn}$'s) Moreover, for better sensitivity, the branches are in accordance the presently preferred embodiment split into terms of the equations given in Eqns. (23)–(34), such that MOSPETs 115–118 ($M_{24z}$ and $M_{25z}$) should be matched; MOSFETs 107–110 ($M_{28z}$ and $M_{27z}$) should be matched; MOSFETs 143–146 ($M_{34z}$ and $M_{35z}$) should be matched; and MOSFETs 135–138 ($M_{37z}$ and $M_{38z}$) should be matched.

Such matching is best achieved when the MOSFETs are fabricated as part of the same integrated circuit, i.e., where all devices have undergone the same manufacturing process, at the same time, and where the devices are dose to each other, and have the same shape and same orientation in the integrated circuit. If the MOSFETs are not matched, ideal symmetry of the filter circuit might not achieved such that output voltage may be offset, the magnitude characteristic deviated from that desired, and the linearity of the filter disturbed. Also, differential output op amps were used because of their linearity and increased noise immunity, which are beneficial features for this application.

With respect to other details of a presently preferred embodiment, it is noted that all of the MOSFET devices are operate din the linear region. The capacitors shown in the circuits of FIGS. 11–13 are those commonly used in the feedback loop of an integrator. Their values here are normalized with respect to the center frequency of the high-order filter.

As discussed previously, two conditions are necessary for linear adjustability of the bandwidth. First, the coefficient of the first order term in the denominator polynomial of the second-order filter transfer function must be implemented by a conductance. Second, that conductance must be linearly controlled by a voltage. The present invention satisfies the problems in the prior art since: (1) all the branches that are a function of $B_A$ (the overall bandwidth of the sixth-order filter) in the signal-flow graphs (SFG) are linearly dependent on $B_A$ as can be seen from Eqns (29-14 40) and Eqns. (5–8); and (2) the conductances of MOSFETs implementing (or corresponding to) those branches are linearly dependent on their controlling voltages, which are gate voltages. The first condition stated above is typically not satisfied in higher-order band-pass filters (such as a sixth-order filter, which is illustratively shown as the preferred embodiment of this invention) because the overall bandwidth will not be a linear function of the individual bandwidths, as explained through Eqns. (9–13) in the following section.

Figure 14:
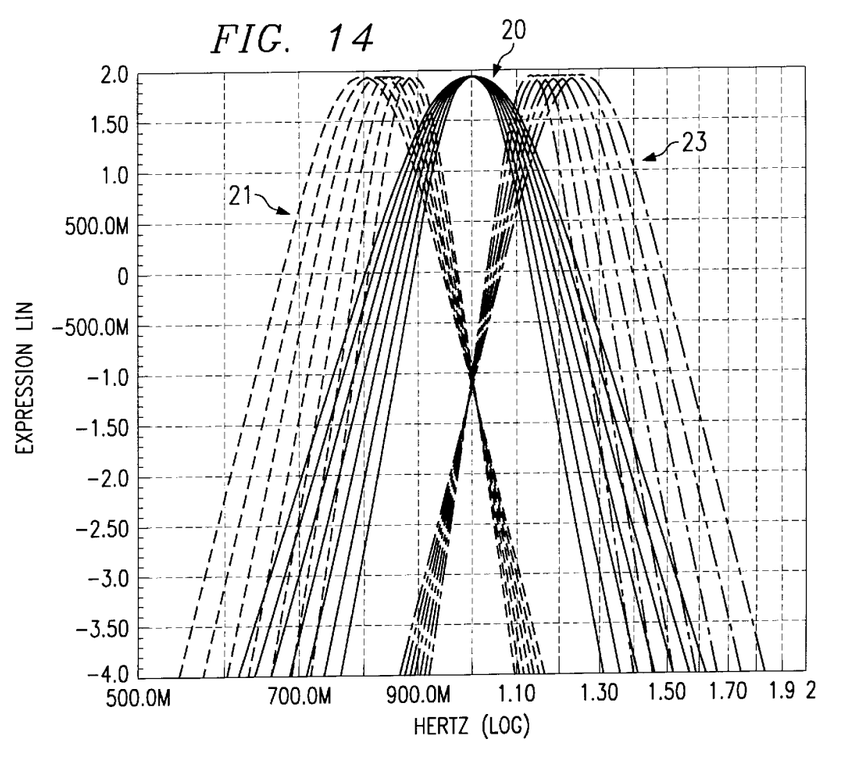
FIG. 14 is a graph that shows the center frequency and bandwidth adjustments in the second-order cascaded sections of a bandpass filter in accordance with this invention.

The present invention, through use of a particular topology, creates a linear relationship between the bandwidth scaling factor ("BWS") and the branch transmittances of the signal flow graphs of all three second-order bandpass building blocks forming the sixth-order bandpass filter of the presently preferred embodiment. The relationship between the overall bandwidth of the sixth-order bandpass filter and the BWS is proportional to the controlling voltages of the conductances, which are linearly dependent on the overall bandwidth, as illustrated by FIG. 14 and as derived and explained through Eqns. (14–40).

Figure 15:
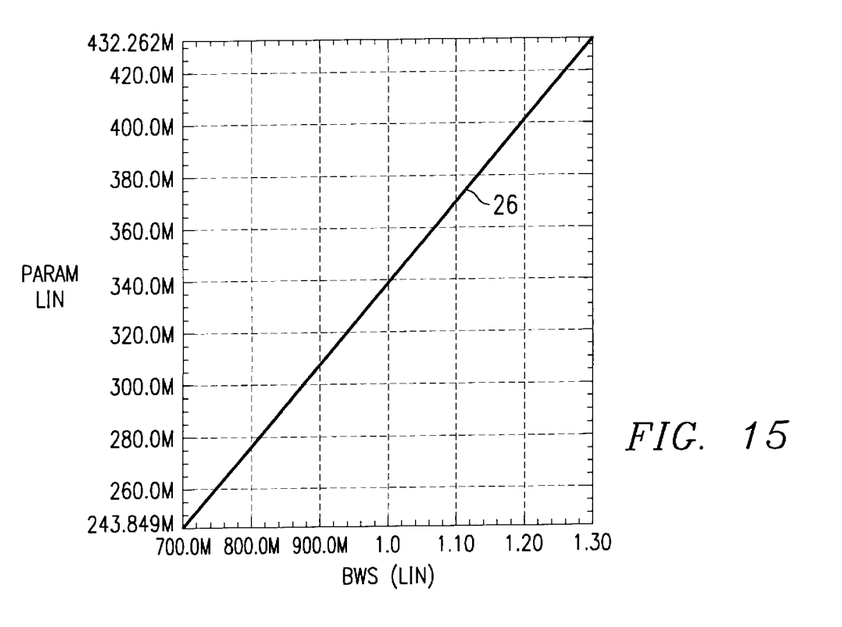
FIG. 15 is a graph that shows the relationship between the controlling variable BWS and the overall bandwidth $B_A$ in a bandpass filter according to the present invention.

FIG. 14 shows how the bandwidths and center frequencies of each individual second-order filter 180–182 change by varying bandwidth control voltage 82. The family of curves 20 represent the first second-order filter 180, the family of curves 21 represent the second second-order section 181, and the family of curves 23 represent the third second-order filter 182. Curves 21 and 23 show how both the center frequencies and the bandwidths of the second and third second-order filters 181–182 change with changing of bandwidth control voltage 82. However, only the bandwidth of the first second-order filter 180 is affected by changes in bandwidth control voltage 82 while its center frequency remains constant. FIG. 15 shows the that the relationship between the bandwidth scaling factor BWS and the overall bandwidth of high-order bandpass filter 158 is linear and monotonous.

In summary, a high-order bandpass filter is usually formed of cascaded second-order bandpass filters. The bandwidth of each individual second-order filter can be adjusted linearly since the bandwidth is directly the coefficient of the first order term in the denominator polynomial and that coefficient can be adjusted by a linearly adjustable transconductance ($g_m$) element or by an adjustable MOSPET conductance. However, the bandwidth of the cascaded overall filter is not simply the linear combination of the bandwidths of the individual second-order filter sections and therefore it cannot be linearly adjusted by merely adjusting the bandwidths of the individual sections. This invention provides the methodology of designing a linearly adjustable high-order bandpass filter by adjusting also the center frequency of each individual bandpass building second-order sections. The invention is explained, by way of an example, in a sixth-order bandpass filter, but it can easily be generalized to higher-order and lower-order filters.

The following equations are considered to illustrate the mechanism that controls the bandwidths and center frequencies of the individual low-order filter sections of a high-order bandpass filter with linearly adjustable bandwidth. The equations therefore explain a method of constructing a high-order bandpass filter according to the present invention.

Relationship between the bandwidths of the cascaded bandpass biquads and the overall filter By way of example, the present invention will be explained in terms of the sixth-order bandpass filter described above and shown in the accompanying drawings. This filter uses cascaded biquadratic sections (herein called "models"), all of which are themselves bandpass filter. The transfer function of the filter can be represented by the following relationship:

$$H_{BP}(s) = \frac{H_1 s}{(s^2 + B_1 s + w_1^2)} \frac{H_2 s}{(s^2 + B_2 s + w_2^2)} \frac{H_3 s}{(s^2 + B_3 s + w_3^2)} \quad (1)$$

In this relationship, $\omega_i$ is the center frequency of the i-th section, $B_i$ is the bandwidth of the i-th section, $H_i$ is the gain of the i-th section at its own center frequency, and s is the frequency parameter where $s = j\omega$ and $107 = 2\pi f$ is the radian frequency (rad/s).

The overall filter transfer function is obtained from a third-order low-pass filter function such as $$H_{LP}(s) = \frac{H_a s}{(s + s)} \frac{H_p w_p^2}{(s^2 + B_p s + w_p^2)} \quad (2)$$

by substituting the lowpass-to-bandpass transformation as:

$$s \rightarrow \frac{s^2 + \omega_0^2}{B_A s} \quad (3)$$

where $B_A$ is the bandwidth of the overall filter, and where $\sigma$ is the open-loop -3 dB frequency (usually $2\pi 10$ Hz) of the first order filter. The overall filter transfer function can be derived in terms of the pole-frequency and the coefficients of the low-pass filter models as:

$$H_{BP}(s) = \frac{H_a B_A \sigma s \quad H_p B_A^2 \omega_p^2 s^2}{(s^2 + B_A \sigma s + \omega_0^2)[s^4 + B_p B_A s^3 + (2\omega_0^2 + B_p \omega_p^2)s^2 + B_p B_A \omega_0^2 + \omega_0^4]} \quad (4)$$

Note that the first biquadratic bandpass function in Eqn. (4) corresponds to the first biquadratic bandpass filter function in Eqn. (1). In order to control bandwidth alone, relationships must also be established between the coefficients of the second and the third bandpass functions in Eqn. (1), which are $B_2$, $B_3$, $\omega_2$, $\omega_3$, and the parameters of the fourth order transfer function in Eqn. (4), which are $B_p$, $B_A$, $\omega_O$ and $\omega_p$. By multiplying the numerator and denominator polynomials of the overall filter transfer functions in Eqn. (1) and matching with Eqn. (4), the following solutions are obtained:

$$H_2 = H_3 = \sqrt{H_p \, B_A w_p} \quad (5)$$

$$H_1 = H_a B_A \sigma \quad (6)$$

$$B_1 = B_A \sigma \quad (7)$$

$$w_1 = w_0 \quad (8)$$

$$B_2 + B_3 = B_p B_A \quad (9)$$

$$w_2 w_3 = w_0^2 \quad (10)$$

$$w_2^2 + w_3^2 + B_2 B_3 = 2w_0^2 + B_p w_p^2 \text{ and} \quad (11)$$

$$B_2 w_2^2 + B_3 w_3^2 = B_p B_A w_p^2 \quad (12)$$

From this, it can be seen that the bandwidth of the bandpass filter section corresponding to the first-order low-pass filter model is linearly adjustable, since the bandwidth of the first-order model (which results from the constant $\sigma$) is directly proportional to the bandwidth of the overall filter. Therefore, to change the overall bandwidth, $B_A$, in a linear fashion, the bandwidth of the first second-order section must be adjustable linearly. The inventor has found that, while this is necessary, it is not sufficient for achieving the desired linear adjustability. The appropriate coefficients for the remaining biquadratic bandpass filter functions must be also obtained, which are linear functions of the overall bandwidth $B_A$. That is, the bandwidth of the second and third second-order sections 181–182, must be adjusted as well. A relationship can be defined between only $B_2$ (or $B_3$) and $B_A$, $B_p$, $\omega_p$, and $\omega_O$ as:

$$B_{23}^4 - 2 B_A B_p B_{23}^3 + (B_A^2 B_p^2 + 2 B_A^2 \omega_p^2 + 4 \omega_0^2) B_{23}^2 - (B_A^3 B_p \omega_p^2 + 4 B_p B_A \omega_0^2) B_{23} + B_A^2 B_p^2 \omega_0^2 = 0 \quad (13)$$

The solution for this equation is the root of 4th order equation and can be expressed as:

$$B_{2,3} = \begin{cases} \frac{1}{2}B_pB_A + \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}} \\ \frac{1}{2}B_pB_A - \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}} \\ \frac{1}{2}B_pB_A + \frac{1}{2}\sqrt{B_p^2B_A^2 - 8\omega_0^2 - 2B_A^2\omega_p^2 - 2\sqrt{16\omega_0^4 + 8\omega_0^2B_A^2\omega_p^2 + B_A^4\omega_p^4 - 4\omega_0^2B_p^2B_A^2}} \\ \frac{1}{2}B_pB_A - \frac{1}{2}\sqrt{B_p^2B_A^2 - 8\omega_0^2 - 2B_A^2\omega_p^2 - 2\sqrt{16\omega_0^4 + 8\omega_0^2B_A^2\omega_p^2 + B_A^4\omega_p^4 - 4\omega_0^2B_p^2B_A^2}} \end{cases} \quad (14)$$

By considering the exemplary values of the presently preferred embodiment, $$B_p = 2.095, \quad (15)$$

$$B_A = 0.3401, \quad (16)$$

$$\omega_p = 1.4474, \quad (17)$$

and $$\omega_0 = 1, \quad (18)$$

(all example values are normalized with respect to the center frequency of the high-order bandpass filter), and by considering positive and real solutions, it follows that $B_2$, $B_3$, $\omega_2$, and $\omega_3$ are related to $B_A$, $B_p$, $\omega_p$ and $\omega_O$ as:

$$B_2 = \frac{1}{2}B_pB_A - \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}} \quad (19)$$

$$B_3 = \frac{1}{2}B_pB_A + \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}} \quad (20)$$

$$\omega_2 = \sqrt{\frac{\frac{1}{2}B_pB_A - \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}}}{\frac{1}{2}B_pB_A + \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}}}} \quad (21)$$

$$\omega_3 = \sqrt{\frac{\frac{1}{2}B_pB_A + \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}}}{\frac{1}{2}B_pB_A - \frac{1}{2}\sqrt{B_p^2B_A^2 - 8\omega_0^2 - 2B_A^2\omega_p^2 + 2\sqrt{16\omega_0^4 + 8\omega_0^2B_A^2\omega_p^2 + B_A^4\omega_p^4 - 4\omega_0^2B_p^2B_A^2}}}} \quad (22)$$

where $B_A$ is the overall bandwidth, $\omega_p$ is the pole frequency of the biquadratic lowpass model that corresponds to the pair of bandpass filter sections under consideration, $\omega_O$ is the center frequency of the target bandpass filter, and $B_p = \omega_p/Q_p$, where is $Q_p$ is the quality factor of the biquadratic lowpass model.

Linear Approximation

By expanding the above equations to McLaurine series about the given values of $B_A$, $B_p$, $\omega_p$ and $\omega_0$, good approximations can be found as:

$$\omega_2^2 = -0.7376\, B_A + 0.9646 \quad (23)$$

$$\omega_3^2 = 1.460\, B_A + 0.19194 \quad (24)$$

or $$\omega_2 = -0.4356\, B_A + 0.9917 \quad (25)$$

$$\omega_3 = 0.6139\, B_A + 0.9719 \quad (26)$$

and $$B_2 = 0.6931\, B_A + 0.0551 \quad (27)$$

$$B_3 = 1.406\, B_A - 0.0556 \quad (28)$$

$\omega_2^2$ and $\omega_3^2$ may be used instead of $\omega_2$ and $\omega_3$ to optimize certain measures, such as element spread. Element spread is the ratio of area of the largest element to the smallest element of the same kind (e.g., the ratio of the capacitors with the largest and smallest areas). Note that the bandwidth adjustment is required to be performed around a certain value, such as 0.3401 which is a normalized value in this exemplary optical disk application. Thus, the equations can be arranged as:

$$\omega_2^2 = -0.7376\,(B_A - 0.3401) + 0.7136 \quad (29)$$

$$\omega_3^2 = 1.460\,(B_A - 0.3401) + 1.416 \quad (30)$$

or by appropriate linear approximation for $\omega_2$ and $\omega_3$ as:

$$\omega_2 = -0.4356\,(B_A - 0.3401) + 0.8436 \quad (31)$$

$$\omega_3 = 0.6139\,(B_A - 0.3401) + 1.189 \quad (32)$$

and $$B_2 = 0.6931\,(B_A - 0.3401) + 0.1807 \quad (33)$$

$$B_3 = 1.406 (B_A - 0.3401) + 0.4226 \quad (34)$$

so that each can be adjusted by a controlling variable $B_A$. The bandwidth can be normalized with respect to the nominal value, that is 0.3401 so that it can be expressed by relative change, that is, for instance ±30% around unity or 0.7 through 1.3 around 1. The above equations can be expressed as:

$$\omega_2^2 = -0.2509 \beta + 0.2509 + 0.7136 \quad (35)$$

$$\omega_3^2 = 0.4965 \beta - 0.4965 + 1.416 \quad (36)$$

$$\omega_2 = -0.1481 \beta + 0.1481 + 0.8436 \quad (37)$$

$$\omega_3 = 0.2088 \beta - 0.2088 + 1.189 \quad (38)$$

and $$B_2 = 0.4782 \beta - 0.4782 + 0.4226 \quad (39)$$

$$B_3 = 0.2357 \beta - 0.2357 + 0.2907 \quad (40)$$

where $\beta$ is normalized bandwidth with respect to nominal value, which is 0.3401, i.e.

$$\beta = B_A / 0.3401.$$

By way of example, a set of values for the center frequency of the high-order filter, the bandwidth of the high-order filter, $V_{FC}$, $V_{BW}$, the center frequencies of the first, second, and third second-order filters (biquads), $\omega_1$, $\omega_2$, $\omega_3$, respectively, and the bandwidths of the first, second, and third second-order filters (biquads), $B_1$, $B_2$, $B_3$, respectively, are shown in Table 1 for the sixth-order bandpass filter that comprises the presently preferred embodiment:

TABLE 1

| | | Biquad 180 | Biquad 181 | Biquad 182 | High-order filter 158 |
|---|---|---|---|---|---|
| $V_{FC}$ (V) | | 0.87 | 0.87 | 0.87 | 0.87 |
| $V_{BW}$ (V) | Minimum BW | 1.1 | 1.1 | 1.1 | 1.1 |
| | Nominal BW | 0.87 | 0.87 | 0.87 | 0.87 |
| | Maximum BW | 0.64 | 0.64 | 0.64 | 0.64 |
| $F_{CTR}$ (kHz) | Minimum BW | 176.4 | 156.7 | 198.6 | 176.4 |
| | Nominal BW | 176.4 | 149.0 | 209.9 | 176.4 |
| | Maximum BW | 176.4 | 141.0 | 220.7 | 176.4 |
| $B_W$ (kHz) | Minimum BW | 55.5 | 38.8 | 49.2 | 42 |
| | Nominal BW | 79.3 | 51.3 | 74.5 | 60 |
| | Maximum BW | 103.1 | 63.8 | 99.8 | 78 |

One embodiment of this invention was described as a sixth-order bandpass filter with linearly adjustable bandwidth for use in optical disk read and write circuit applications. While this invention has been described with reference to that illustrative embodiment, that description is not to be construed in a limiting sense. Various modification to the illustrative embodiment, as well as other embodiments of the invention, will be apparent to persons skilled in the art upon reference to this description. For example, the invention may easily be applicable to other types of filters and to other types of filter implementations, such as Transconductance-C filters. It also may have applications in filters used in products other than optical storage media devices. It is therefore contemplated that the appended claims will cover any such modification or embodiments that fall within the true spirit and scope of the invention.

What is claimed is:

1. A writeable optical disk wobble signal capture system comprising:

a storage device;

a first controller operably connected to said storage device;

a second controller operably connected to said storage device;

a high-order bandpass filter with linearly adjustable bandwidth, said bandpass filter formed of cascaded low-order bandpass filters, and wherein said high-order bandpass filter is used to capture said writeable optical disk wobble signal;

one or more digital-to-analog converters, each said one or more digital-to-analog converters operably connected to said high-order bandpass filter, and operably connected to one of said first controller and said second controller;

read head device operably connected to said high-order bandpass filter; and write head device operably connected to said high-order bandpass filter, said write head device using said writeable optical disk wobble signal for location information.

2. The system recited in claim 1, said low-order cascaded filters comprising second-order filters.

3. The system recited in claim 1 where said high-order bandpass filter is a sixth-order filter.

4. The system recited in claim 1 wherein said optical disk is a Digital Versatile Disk.

5. The system recited in claim 1 wherein said optical disk is a Digital Video Disk.

6. The system recited in claim 1 wherein said optical disk is a Compact Disk.

7. The system recited in claim 1 wherein said storage device stores firmware.

8. The system recited in claim 7 wherein said first controller receives some of said firmware, said some of said firmware decoded to generate center frequency control signals for said high-order bandpass filter.

9. The system recited in claims 8 wherein said one or more digital-to-analog converters converts said bandwidth control signals to dc voltages, said dc voltages used by said high-order bandpass filter to adjust the bandwidth of said high-order filter.

10. The system recited in claim 7 wherein said second controller receives some of said firmware, said some of said firmware decoded to generate bandwidth control signals for said high-order bandpass filter.

11. The system recited in claim 1 wherein said storage device is a read-only memory.

12. The system recited in claim 1 wherein said storage device is a random-access memory.

* * * * *